(12) United States Patent
Jan et al.

(10) Patent No.: US 7,815,227 B2
(45) Date of Patent: Oct. 19, 2010

(54) LATCHING MECHANISM

(75) Inventors: Te-Sheng Jan, Taipei Hsien (TW); Yu-Tao Chen, Taipei Hsien (TW); Chun-Che Yen, Taipei Hsien (TW); Jian-Jun Li, Shenzhen (CN); Gang Cheng, Shenzhen (CN); Zheng-Qiang Song, Shenzhen (CN); Meng-Hua He, Shenzhen (CN); Bing-Jing Xu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 202 days.

(21) Appl. No.: 11/972,630

(22) Filed: Jan. 11, 2008

(65) Prior Publication Data
US 2009/0096221 A1    Apr. 16, 2009

(30) Foreign Application Priority Data
Oct. 15, 2007    (CN) .................. 2007 1 0202060

(51) Int. Cl.
*E05C 9/00*    (2006.01)
*E05C 19/06*    (2006.01)
(52) U.S. Cl. ............... 292/27; 292/19; 292/DIG. 37
(58) Field of Classification Search ........... 292/80, 292/107, DIG. 37, 8, 17, 19, 24, 25, 27, 31, 292/81, 87, 88, 91, 95, 116; 24/601.1, 632, 24/634, 662
See application file for complete search history.

(56) References Cited

U.S. PATENT DOCUMENTS

| | | | | |
|---|---|---|---|---|
| 988,114 A | * | 3/1911 | la Belle | 292/27 |
| 2,506,846 A | * | 5/1950 | Teasdale | 70/58 |
| 3,466,075 A | * | 9/1969 | Wurster et al. | 292/19 |
| 4,133,142 A | * | 1/1979 | Dzus, Jr. | 49/379 |
| 4,250,599 A | * | 2/1981 | Nagashima et al. | 24/326 |
| 6,325,427 B1 | * | 12/2001 | Daoud | 292/27 |
| 6,676,177 B2 | * | 1/2004 | Daoud et al. | 292/202 |
| 2009/0090719 A1 | * | 4/2009 | Jan et al. | 220/324 |
| 2009/0094808 A1 | * | 4/2009 | Jan et al. | 24/601.1 |
| 2009/0184523 A1 | * | 7/2009 | Li et al. | 292/139 |

* cited by examiner

*Primary Examiner*—Peter M Cuomo
*Assistant Examiner*—Alyson M Merlino
(74) *Attorney, Agent, or Firm*—Frank R. Niranjan

(57) ABSTRACT

An exemplary latching mechanism (20) includes a base (22) having two resilient claps (224), a detachable portion (24) having two resilient clasps (244) for engaging with the hooking portions of the base, and an unlatching element (25). The unlatching element defines two engaging slots (258) and is disposed between the base and the detachable portion. The resilient clasps of the detachable portion engage with the hooking portions of the base when the detachable portion is pressed to be latched to the base. The resilient clasps engage in the engaging slots of the unlatching element when the detachable portion is pressed to be detached from the base. Then the detachable portion and the unlatching element together move away from the base. The engagement of the detachable portion and unlatching element makes the at least one resilient clasp deforms and thus disengages from the at least one hooking portion of the base.

12 Claims, 5 Drawing Sheets

LATCHING MECHANISM

BACKGROUND OF THE INVENTION

1. Field of the Invention

The present invention relates to latching mechanisms, more particularly to a latching mechanism that is convenient to operate.

2. Discussion of the Related Art

Various types of consumer products such as toys, portable electronic devices, and most other devices with a mechanical feature usually includes two connected members. The connected members are usually designed to be latch to and/or unlatch from each other.

Typical connected members includes a main body and a cover. An end of each of the main body and the cover may be pivotably connected by a pivot shaft. A hook and a catch may be formed at another end of each of the main body and the cover, respectively. By pressing the cover downwards, the hook and the catch of the main body and the cover engages with each other, respectively, such that the cover is latched to the main body. By moving the hook or the catch in a predetermined direction, the hook detaches from the catch such that the cover becomes unlatched from the main body.

However, when opening the cover, a relative large force may need to be applied to move the hook or the catch. Therefore, it is inconvenient to operate. In addition, actions of opening and closing the cover, of different products may not be similar, thus users may need to change the action of his/her hand(s) frequently when opening or closing the cover of different products. That further increases the inconvenience of operation.

Therefore, a latching mechanism which is convenient to be operated is desired.

SUMMARY

An exemplary latching mechanism includes a base, a detachable portion and an unlatching element. The base has two hooking portions. The detachable portion has two resilient clasps for engaging with the hooking portions of the base. The unlatching element defines two engaging slots and is disposed between the base and the detachable portion and above the base. The resilient clasps of the detachable portion engage with the hooking portions of the base when the detachable portion is pressed to be connected to the base. The resilient clasps engage in the engaging slots of the unlatching element when the detachable portion is pressed to be detached from the base. Then the detachable portion and the unlatching element together move away from the base. The engagement of the detachable portion and unlatching element makes the at least one resilient clasp deforms and thus disengages from the at least one hooking portion of the base.

Other advantages and novel features will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of the present latching mechanism. Moreover, in the drawings, like reference numerals designate corresponding parts throughout the several views, and all the views are schematic.

DETAILED DESCRIPTION OF THE EMBODIMENTS

The present invention provides a latching mechanism usually employed in products such as electronic devices and toys.

Figure 1:
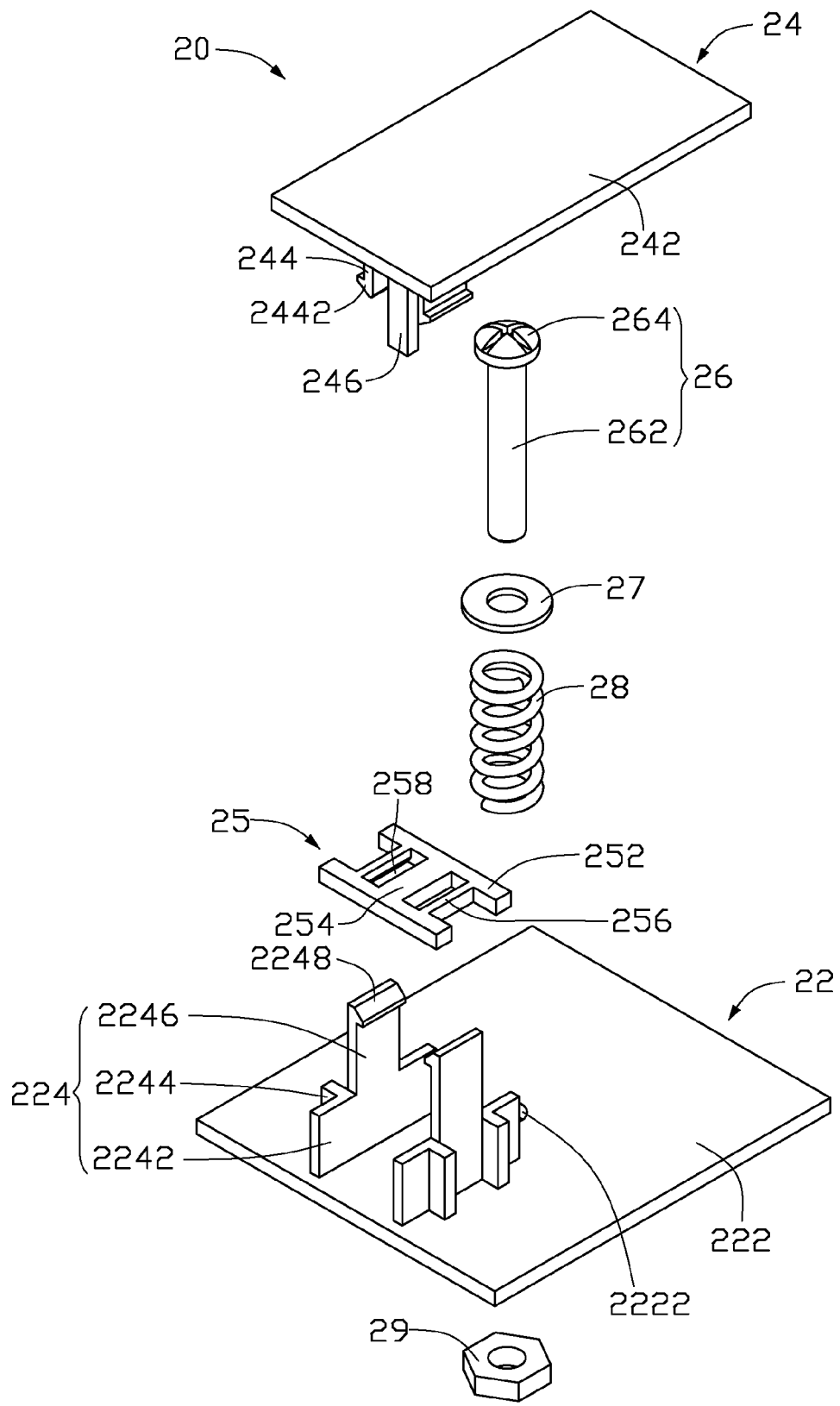
FIG. 1 is an exploded, isometric view of an embodiment of a latching mechanism of the present invention.
Figure 2:
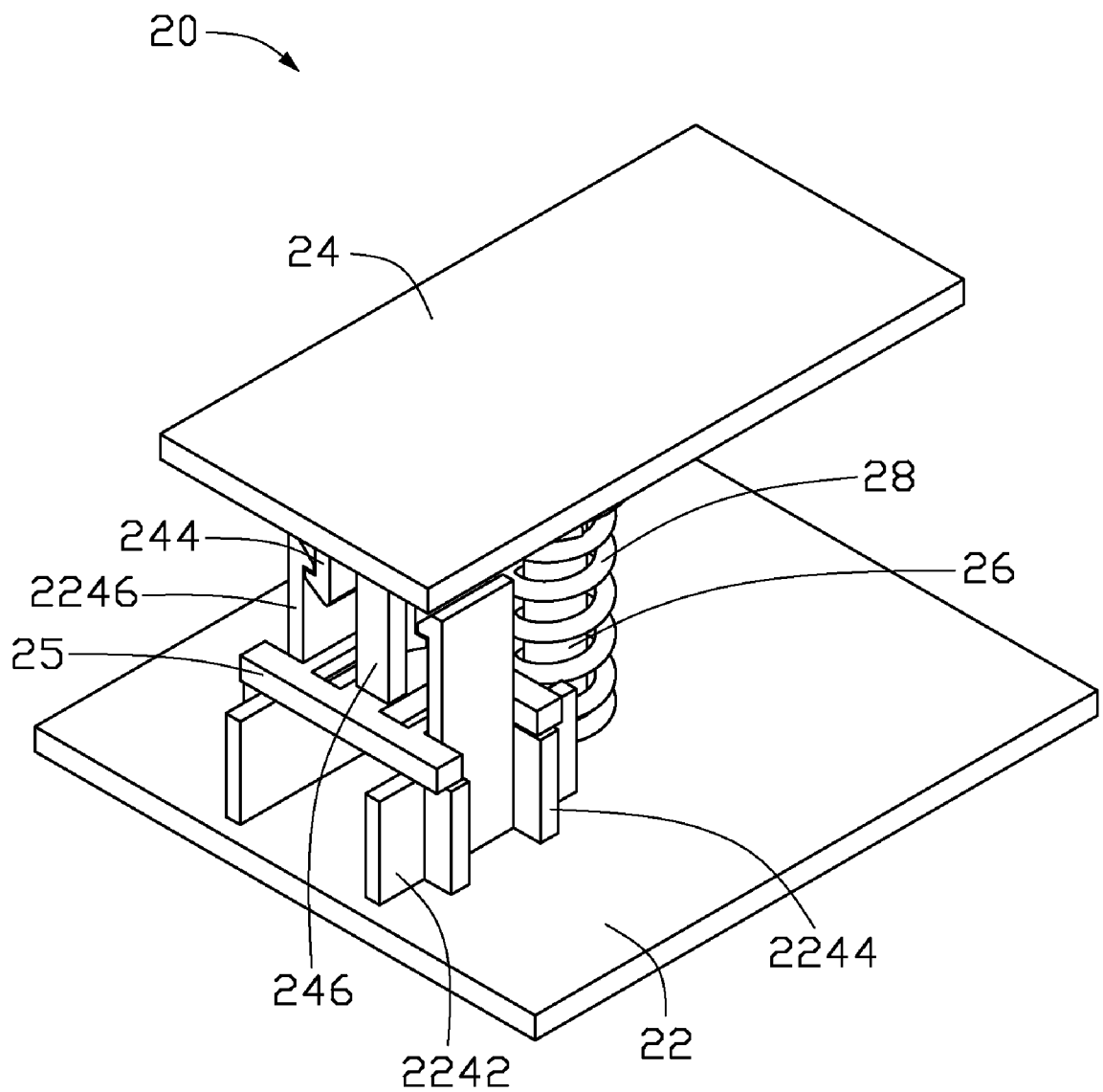
FIG. 2 is an assembled, isometric view of the latching mechanism of FIG. 1.

Referring to FIGS. 1 and 2, a latching mechanism 20 of an embodiment of the present invention includes a base 22, a detachable portion 24, an unlatching element 25, a pushing shaft 26, a washer 27, a resilient member 28, and a fixing member 29.

The base 22 includes a main sheet 222 and two hook portions 224 extending from a top surface main sheet 222. The main sheet 222 is substantially a flat sheet defining a through hole 2222. The hooking portions 224 includes a supporting sheet 2242 extending perpendicularly from the main sheet 222, a support extension 2244 extending from the main sheet 222 and being perpendicular to the main sheet 222 and the supporting sheet 2242, and an extending sheet 2246 extending from a top end of the supporting sheet 2242. The extending sheet 2246 includes a hook 2248 formed at an end thereof. The two hooking portions 224 are aligned as mirror image of each other, with the support extensions 2244 of the hooking portions 224 pointing away from each other and the hooks 2248 of the hooking portions 224 pointing toward each other.

The detachable portion 24 includes a press receiving portion 242, two resilient clasps 244, and two restricting portions 246. The press receiving portion 242 is substantially a flat sheet. The resilient clasps 244 and the restricting portions 246 extend perpendicularly from the press receiving portion 242. Each exposing end of resilient clasps 244 includes a clasp end 2442. The resilient clasps 244 are aligned as mirror image of each other, with the clasp ends 2442 of the resilient clasp 244 pointing toward each other. The restricting portions 246 have a height taller than a length of each of the resilient clasps 244 excluding the clasp end 2442. The two restricting portions 246 are offset from each other, with one restricting portion 246 disposed in the front of the resilient clasps 244 and another restricting portion 246 disposed in the back of the resilient clasps 244. A longest distance between the clasp ends 2442 of the resilient clasps 244 is slightly larger than a shortest distance between the hooks 2248 of the hooking portions 224, such that the clasp ends 2442 can engage with the hooks 2248 when the hooking portion 224 and the resilient clasps 244 are pushed to close to each other.

The unlatching element 25 is a flat sheet defines two spaced engaging slots 258 therein. The unlatching element 25 includes two parallel elongated beams 252, a first connecting portion 254, and two second connecting portions 256. The first and second connecting portions 254, 256 are perpendicularly connected to the elongated beams 252 and disposed between the elongated beams 252. The first connecting portion 254 is disposed between the second connecting portions 256, and is spaced from the second connecting portions 256. An outer-sidewall each of the engaging slots 258 forms a slanted surface (not labeled, see broken lines in FIG. 3). The slanted surfaces extend away from the engaging slots 258, from a portion of the outer-sidewall to a bottom surface of the unlatching element. A distance between the second connecting portions 256 defining the engaging slots 258 is less than a longest distance between the two extending sheets 2246 of the base 22.

The pushing shaft 26 includes a shaft portion 262 and a shaft head 264. The shaft portion 262 and the shaft head 264 are cylindrical, and a diameter of the shaft head 264 is larger than that of the shaft portion 262. A screw thread (not shown) is formed on the shaft portion 262.

The washer 27 is ring-shaped. The resilient member 28 is a compressed, spiral spring. The fixing member 29 is a nut for engaging with the screw thread of the pushing shaft 26.

In assembling, a hinge (not shown) is assembled to the base 22 and one end of the detachable portion 24 away from the resilient clasps 244 and the restricting portions 246. Alternatively, the hinge can be omitted and the detachable portion 24 may be connected to the base 22 via the hooking portions 224 and the resilient clasps 244 only. The unlatching element 25 is placed above the supporting sheets 2242 and the support extensions 2244 with the second connecting portions 256 disposed between and kept touching with the extending sheets 2246.

The unlatching element 25 is movable relative to the base 22 between a first position and a second position. In a first position, referring to FIG. 3, the unlatching element 25 is positioned on a top surface of the supporting sheets 2242 and the support extensions 2244. In a second position, referring to FIG. 5, the unlatching element 25 is positioned above and away (at a distance) from the supporting sheets 2242 and the support extensions 2244 of the base 22.

The shaft portion 262 of the pushing shaft 26 runs through the washer 27, the resilient member 28, and the through hole 2222 of the base 22 in that order, and then the fixing member 29 engages with an end of the pushing shaft 26 opposite to the shaft head 264. As such, the resilient member 28 is slightly compressed to a first compressed state and the pushing shaft 26 and the resilient member 28 are below the press receiving portion 242 of the detachable portion 24.

Figure 3:
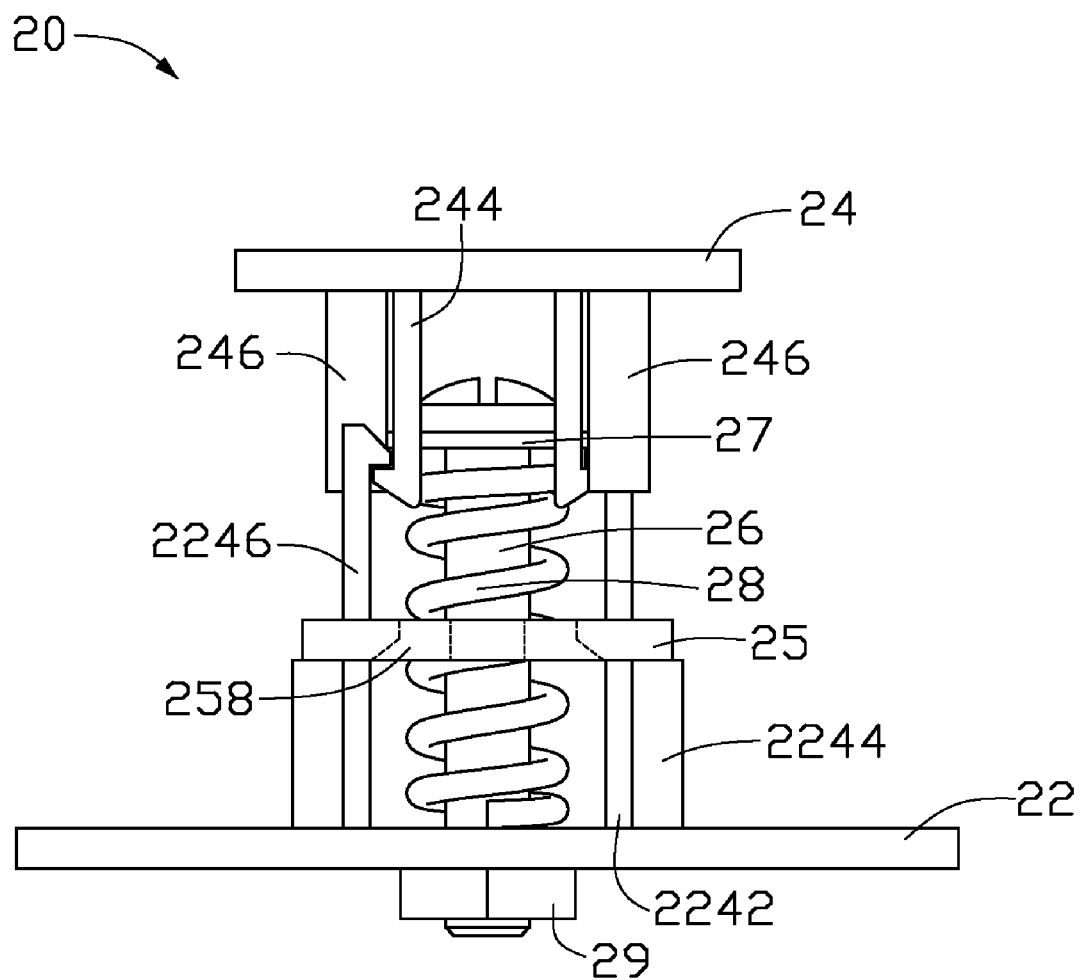
FIG. 3 is a front view of the latching mechanism of FIG. 1 at a first state.

In use, referring to FIG. 3, when the detachable portion 24 is latched to the base 22, the unlatching element 25 is in the first position, and the clasp ends 2442 of the detachable portion 24 and the hooks 2248 of the base 22 engage with each other. The detachable portion 24 is at a distance away from the unlatching element 25.

Figure 4:
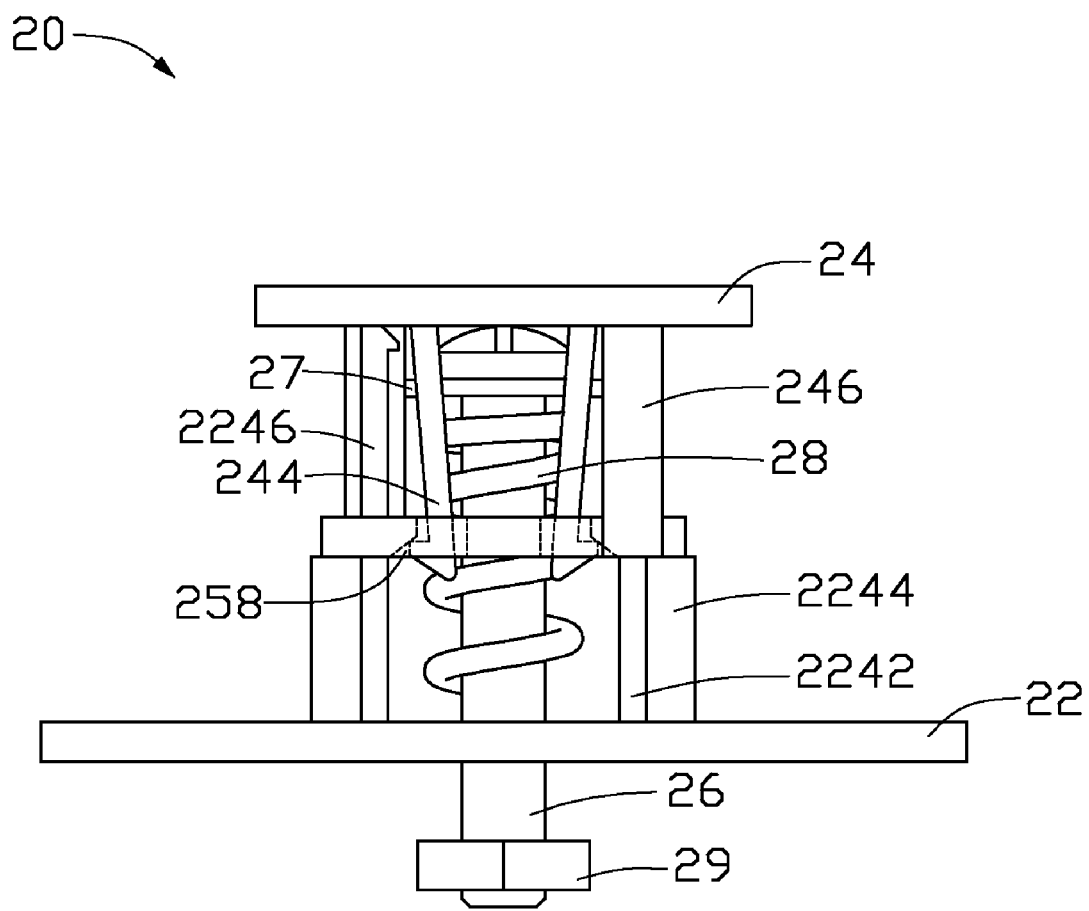
FIG. 4 is a front view of the latching mechanism of FIG. 1 at a second state.

When detaching the detachable portion 24 from the base 22, referring to FIG. 4, the detachable portion 24 is pressed towards the base 22, the clasp ends 2442 of the detachable portion 24 slide into the engaging slots 258 of the unlatching element 25. When the resilient clasps 244 are inserted into the engaging slots 258, because a widest distance between the clasp ends 2442 at rest is smaller than a widest distance between outer-sidewalls of the engaging slots 258, would cause the resilient clasps 244 to deform towards each other. The claps ends 2442 would then abut (engage) with the slanted sidewalls of the engaging slots 258 correspondingly. In other words, the clasp ends 2442 would partially hook onto the slanted sidewalls. Furthermore, the detachable portion 24 presses the pushing shaft 26, thus causing the resilient member 28 to be compressed to a second compressed state. After the detachable portion 24 moves at a distance towards the base 22, the restricting portions 246 hit the top surface of the supporting sheets 2242 and the support extensions 2244, thereby restring the detachable portion 24 from further moving toward the base 22.

Figure 5:
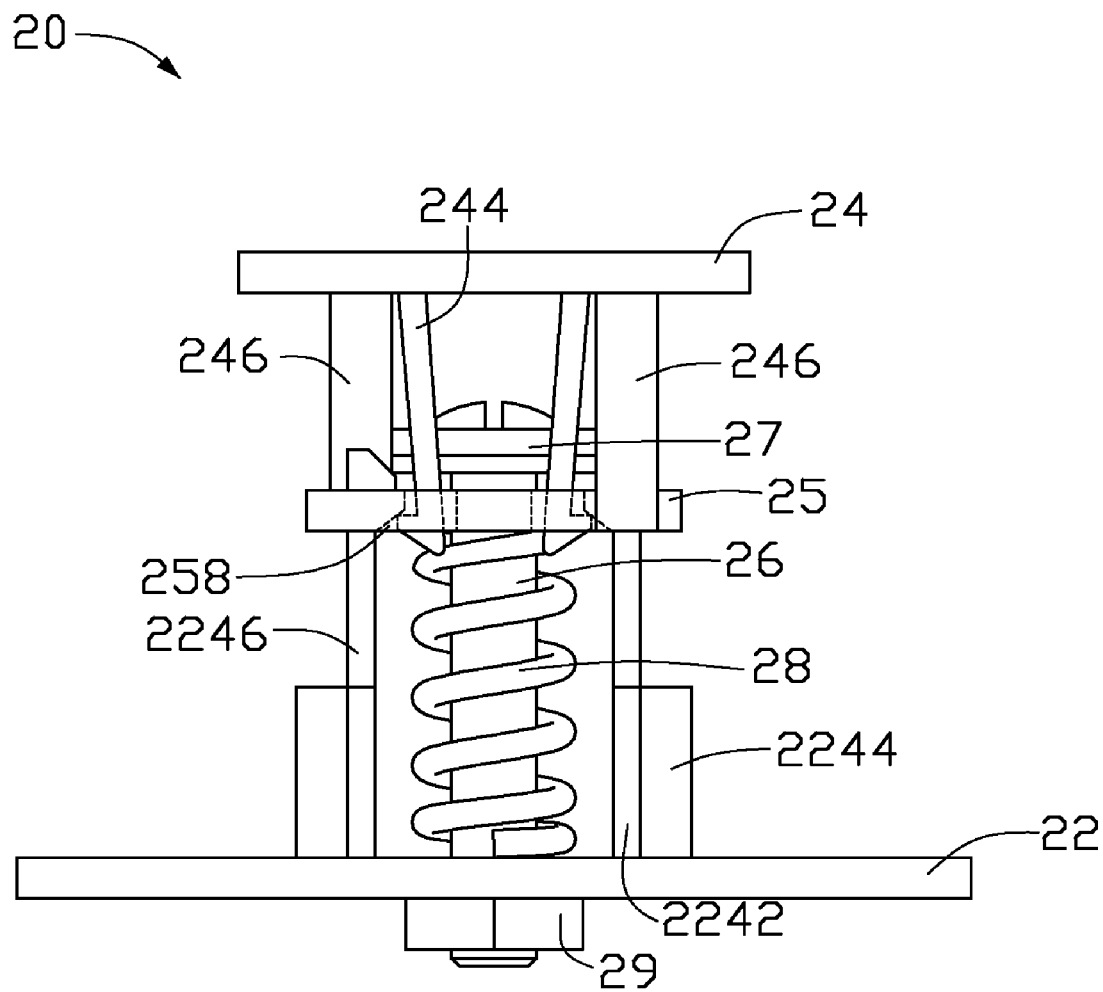
FIG. 5 is a front view of the latching mechanism of FIG. 1 at a third state.

Referring to FIG. 5, the detachable portion 24 is then released, (no longer pressed), the resilient member 28, compressed to the second compressed state would spring back to the first compressed state. Thus pushing the pushing shaft 26 outwards, and in effect pushing the detachable portion 24 away from the base 22 also. Because the clasp ends 2442 are partially hooked into the engaging slots 258, when the detachable portion 24 is pushed away from the base 22, the clasp 244 would carry the unlatching element 25 away from also. Furthermore, because the clasp ends 2442 are deformed, the hooks 2248 would not block the clasp 244, instead the hooks 2248 would block the unlatching element 25 at the top surface. When the unlatching element 25 is carried at this point, because the clasp ends 2442 are only partially hooked in the engaging slots 258, the clasp ends 2442 would detach from the engaging slots 258, thus releasing (unlatching) the detachable portion 24 from the base 22. The unlatching element 25 is in its second position.

When the detachable portion 24 is pressed towards the base 22 again, the resilient clasps 244 of the detachable portion 24 moves towards an interior side of the extending sheets 2246 of the base 22 under guiding of slant surfaces of the clasp ends 2442 and the hooks 2248. Thereby, the clasp ends 2442 of the detachable portion 24 and the hooks 2248 of the base 22 engage with each other again.

Alternatively, the restricting portion 246 of the detachable portion 24 may be omitted. With the condition, stop pressing the detachable portion 24 until the detachable portion 24 engages with the base 22 when operating. The washer 27 may be omitted. The fixing member 29 may also be a ring and the pushing shaft 26 defines a ring-shaped groove for engaging with the ring. The fixing member 29 may also be omitted. With the condition, the pushing shaft 26 is riveted after assembling. The resilient member 28 may also be other type of resilient members such as rubber sticks. The pushing shaft 26 may be omitted. In this case, the resilient member 28 is lengthened. Facing directions of the clasp ends 2442 and the hooks 2248 may be exchanged with each other.

With the latching mechanism 20, a same action on the detachable portion 24 of pressing the detachable portion 24 can make the detachable portion 24 to be latched on or detached from the base 22. In the process of latching or detaching the detachable portion 24, a user can operate on the latching mechanism 20 without changing the action of his/her hand. Therefore, the latching mechanism 20 is very convenient. Especially when repeatedly latching and detaching the detachable portion 24, this convenience is much more remarkable.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A latching mechanism, comprising:
   a base having two hooking portions;
   a detachable portion for connecting to the base, the detachable portion including two resilient clasps for engaging with the two hooking portions of the base;
   a resilient member disposed between the base and the detachable portion and providing elastic force therebetween; and
   an unlatching element defining two engaging slots, the unlatching element disposed between the base and the detachable portion and above the base;
   wherein the two resilient clasps of the detachable portion engage with the two hooking portions of the base when the detachable portion is pressed to be connected to the base; the two resilient clasps engage in a corresponding engaging slot of the unlatching element when the detachable portion is pressed to be detached from the base, the detachable portion and the unlatching element together move away from the base; the movement of the unlatching element towards the detachable portion allows the two resilient clasps to disengage from the unlatching element.

2. The latching mechanism as claimed in claim 1, wherein the unlatching element moves with the detachable portion after the resilient clasps have been disengaged from the hooking portions of the base.

3. The latching mechanism as claimed in claim 2, wherein the resilient member is a compressed, spiral spring.

4. The latching mechanism as claimed in claim 2, further comprising a pushing shaft, the base defining a through hole, the pushing shaft running through the resilient member and the through hole of the base.

5. The latching mechanism as claimed in claim 4, wherein the latching mechanism further comprises a washer and a fixing member, the pushing shaft includes a shaft head and a shaft portion, the washer is sleeved on the shaft portion of the pushing shaft and is disposed between the resilient member and the shaft head, and the fixing member is fixed on an end opposite to the shaft head of the pushing shaft, the base, the resilient member and the washer are positioned between the shaft head and the fixing member.

6. The latching mechanism as claimed in claim 1, wherein the base further comprises a main sheet, the two hooking portions are formed on the main sheet, each hooking portion includes a supporting sheet extending perpendicularly from the main sheet, a support extension extending from the main sheet and being perpendicular to the main sheet and the supporting sheet, and an extending sheet extending from a top of the supporting sheet, the extending sheet has a hook at an end thereof, the two hooking portions are aligned as mirror images of each other, with the support extensions of the hooking portions pointing away from each other and the hooks of the hooking portions pointing toward each other.

7. The latching mechanism as claimed in claim 6, wherein the detachable portion further has a press receiving portion, the press receiving portion is substantially a flat sheet, the resilient clasps extend perpendicularly from the press receiving portion, a clasp end is formed at one end of each resilient clasp, the resilient clasps are aligned as mirror image of each other, with the clasp ends of the resilient clasps pointing toward each other.

8. The latching mechanism as claimed in claim 7, wherein a maximal distance between the clasp ends of the resilient clasps is slightly larger than a minimal distance between the hooks of the hooking portions.

9. The latching mechanism as claimed in claim 7, wherein the detachable portion further comprises two restricting portions, the restricting portions are perpendicularly extended from the press receiving portion, the restricting portions each have a length larger than a length of each of the resilient clasps excluding the clasp ends, the two resilient clasps are abreast disposed, one restricting portion is disposed in the front of the resilient clasps, and another restricting portion is disposed in the back of the resilient clasps.

10. The latching mechanism as claimed in claim 9, wherein a distance between the two engaging slots is smaller than a distance between the two extending sheets of the base.

11. The latching mechanism as claimed in claim 10, wherein the unlatching element comprises two parallel elongated beams, a first connecting portion, and two second connecting portions, the first and second connecting portions are perpendicularly connected to the elongated beams and disposed between the elongated beams, the first connecting portion is disposed between the second connecting portions, and is spaced apart from the second connecting portions, and an outer-sidewall of each engaging slot forms a slant surface.

12. A latching mechanism, comprising:
a base having two hooking portions;
a detachable portion having two resilient clasps for engaging with the two hooking portions of the base;
a resilient member disposed between the base and the detachable portion and providing elastic force therebetween; and
an unlatching element disposed between the base and the detachable portion, the unlatching element configured for forcing the two resilient clasps of the detachable portion to deform and disengage from the hooking portions;
wherein the detachable portion is pressed to come into engagement with the base when the detachable portion is separated from the base; the detachable portion is detached from the base with further pressing of the detachable portion.

* * * * *